(12) United States Patent
Magnusson

(10) Patent No.: US 6,496,792 B1
(45) Date of Patent: Dec. 17, 2002

(54) TRANSACTION CHECKING FOR SYSTEM ARCHITECTURE VALIDATION

(75) Inventor: Eric J. Magnusson, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/111,126

(22) Filed: Jul. 6, 1998

(51) Int. Cl.[7] ............................................... G06F 17/50
(52) U.S. Cl. .............................. 703/27; 703/17; 714/37; 714/45
(58) Field of Search ........................... 703/16, 17, 21, 703/27; 714/37, 39, 45, 49, 736

(56) References Cited

U.S. PATENT DOCUMENTS

| 4,433,413 A | * | 2/1984 | Fasang ........................ 714/732 |
| 5,448,722 A | * | 9/1995 | Lynne et al. .................. 706/49 |
| 5,568,407 A | * | 10/1996 | Hass et al. ................... 702/118 |
| 5,726,920 A | * | 3/1998 | Chen et al. ................... 702/108 |
| 6,021,261 A | * | 2/2000 | Barrett, Jr. et al. ........... 714/37 |

OTHER PUBLICATIONS

Tayal, S. et al. "System Level Verification of ASIC Chipsets," 6th Annual IEEE Int'l ASIC Conf. and Exhibit. Sep. 27–Oct. 1, 1993.*

* cited by examiner

Primary Examiner—Kyle J. Choi
(74) Attorney, Agent, or Firm—Blakely, Sokoloff, Taylor & Zafman LLP

(57) ABSTRACT

A method and apparatus for a transaction checking for system architecture validation are provided. Tracking data is received from trackers in the system. The tracking data is parsed to construct queues. These queues are compared with each other. For one embodiment, the queues are further compared with predicted behavior of the element that was tested. Discrepancies between the queues and the queue and predicted behavior are flagged.

59 Claims, 6 Drawing Sheets

TRANSACTION CHECKING FOR SYSTEM ARCHITECTURE VALIDATION

FIELD OF THE INVENTION

The present invention relates to testing computer systems, and more specifically, to system architecture validation.

BACKGROUND

Thorough pre-silicon testing of integrated circuits and computer systems is an essential step in obtaining a production quality design. However, there are hindrances to the successful validation of increasingly-complex designs: difficulty in discovering subtle errors in simulation results, the lack of consistent and comprehensive checking methodologies for complex transaction scenarios, and the extensive time and experience required for quality simulation analysis.

To effectively validate a system, simulation results must be analyzed. The results should be analyzed in real time or captured for post-simulation analysis. During the simulation, all system activity is recorded in log files called trackers. These trackers, located at each transaction interface, provide a macroscopic view of bus transactions. The host tracker, for example, lists all processor bus activity as well as second-level cache cycles, inquire/snoop cycles, and system interrupts. Generally, trackers are located at all system transaction and event interfaces, including main memory (DRAM), industry standard architecture (ISA) bus, and peripheral component interconnect (PCI) bus. Once simulation events have been recorded for a particular test suite, they must be evaluated for correctness.

One prior art method of evaluation is to obtain an initial "good" simulation. This is done by actually visually inspecting the output of an initial simulation and determining its accuracy. For each type of test, an initial good simulation must be performed and inspected.

Further simulations are compared against the results of the known good simulation. There are several weaknesses with this approach. First, although one assumes that the prior "good" simulation is free of bugs, it may still contain errors that were missed by the visual inspection. Second, methods for comparing the results of the initial good simulation and the current simulation must be sophisticated (as opposed to the simple UNIX "diff" program) to provide for allowable differences, such as system latency, but detect subtle differences like single bit errors. A subtle error may pass undetected during an early test and propagate through subsequent testing because its "diff" is clean.

An example of comparing an initial good simulation with simulation runs was performed. Bus trackers were generated and stored for each of the suite of seven-hundred and fifty regression tests. A variant of the UNIX "diff" program was created to compare the results of each test to prior "known good" results. This tedious, error prone process required one week for an engineer to review all the observed differences. On several occasions, the "known good" results were found to have errors, and differences that showed bugs were ignored.

Thus, a tool that consistently analyzes simulation results in an automated fashion independent of the results of previous simulation iterations would be advantageous.

SUMMARY OF THE INVENTION

A method and apparatus for transaction checking for system architecture validation are described. Tracking data is received from trackers in the system. The tracking data is parsed to construct queues. These queues are compared with each other. For one embodiment, the queues are further compared with predicted behavior of the element that was tested. Discrepancies between the queues and the predicted behavior are flagged.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for transaction checking for system architecture validation are described. A tool analyzes transactions recorded in simulation log files for correctness. The tool also reports any discrepancies it detects between actual simulation results and a predicted response of a device being tested as defined in a design specification. The tool detects transaction corruption, and ensures compliance to cache, memory, and buffer coherency rules.

The tool processes and verifies transactions flowing through the entire system. Transactions may target or originate from components such as the processor, cache, main memory, keyboard, direct memory access (DMA), integrated drive electronics (IDE), accelerated graphics port (AGP), peripheral memory interconnect (PCI), industry standard architecture (ISA), and extended industry-standard architecture (EISA) devices. For one embodiment, the present system validates system transactions by ensuring that a transaction is not corrupted at any intermediate point in the system. For example, a transaction between the processor and ISA bus is validated by independently validating the separate transactions from the processor to the PCI bus, and from the PCI bus to the ISA bus. If the transaction is propagated through each of the components without corruption, then it has been validated for the entire path. For one embodiment, the present system also checks that proper side-effect transactions occur. Side-effect transactions are transactions that are peripheral to the main transaction, but are necessary for compliance with the specification for that transaction. As an example, for system components targeting main memory, the present system not only validates the main memory transaction, but also ensures that the proper cache inquire cycles occur.

Figure 1:
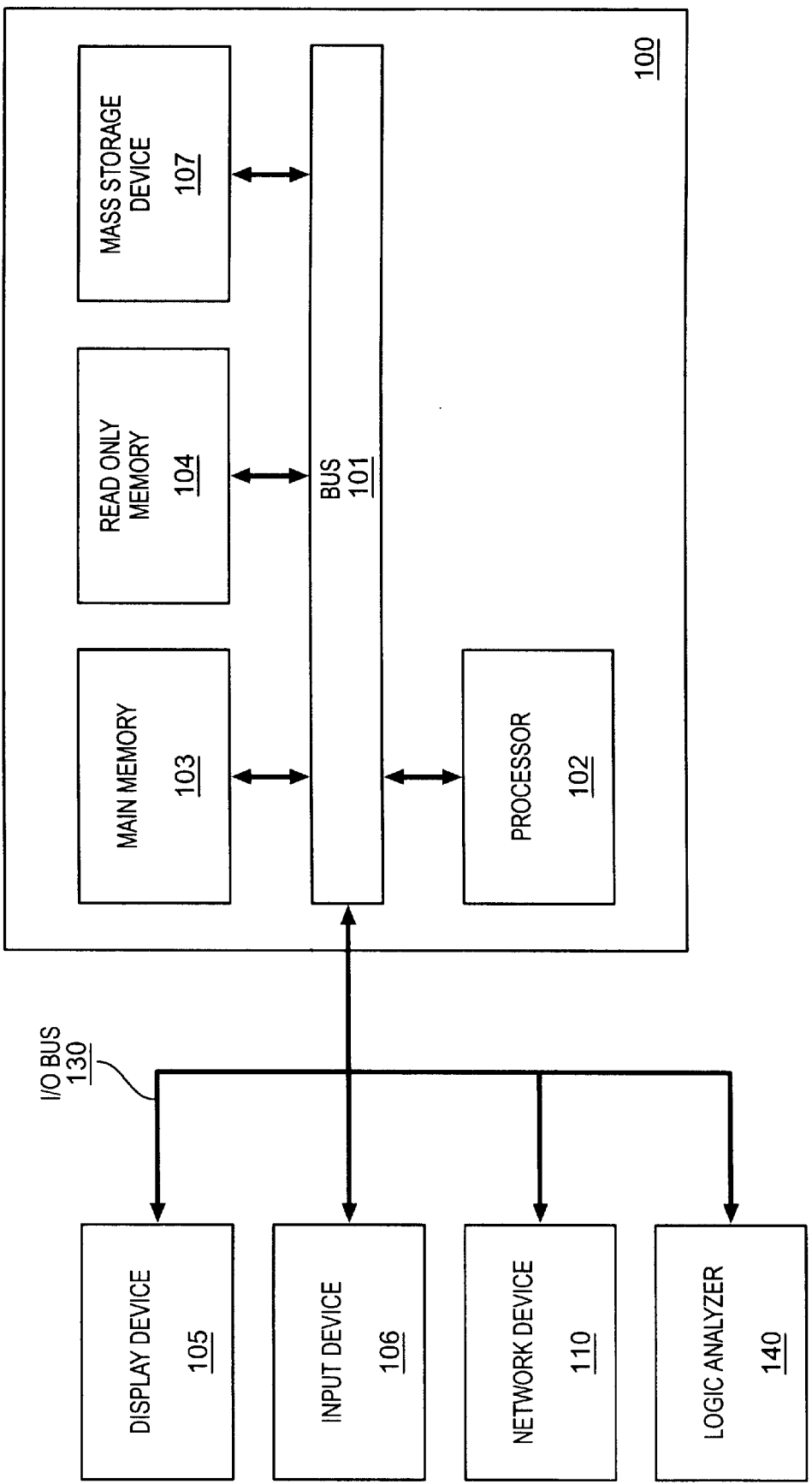
FIG. 1 is a block diagram of one embodiment of a computer system.

FIG. 1 is a block diagram of a computer system 100. Computer system 100 comprises a bus 101 or other communication mechanism for communicating information, and a processor 102 coupled with bus 101 for processing information. Computer system 100 also comprises a read only memory (ROM) and/or other static storage device 104 coupled to bus 101 for storing static information and instructions for processor 102.

The computer system 100 further comprises a main memory 103 for storing information and instructions to be executed. Main memory 103 also may be used for storing temporary variables or other intermediate information during execution of instructions. In one embodiment the main memory 103 is dynamic random access memory (DRAM).

Computer system 100 can also be coupled via I/O bus 130 to a display device 105, such as a cathode ray tube (CRT) or liquid crystal display (LCD) screen, for displaying information to a computer user. An input device 106 is typically coupled to I/O bus 130 for communicating information and command selections to processor 102. The input device 106 may be a keyboard. Another type of user input device 106 is cursor control device 106, such as a mouse, a trackball, trackpad, or cursor direction keys for communicating direction information and command selections to processor 102 and for controlling cursor movement on display device 105. Alternatively, other input devices 106 such as a stylus or pen can be used to interact with the display. Alternatively, these devices may be coupled to the computer system 100 via the bus 101 or a PCI bus (not shown).

The computer system 100 may further be coupled via the I/O bus 130 to a network device 110 for communicating with other computers. The network device 110 may be a modem, a network card, or other device to communicate between the computer system 100 and other systems or networks. A logic analyzer 140 may further be coupled to the bus 130. The logic analyzer 140 may be used to track outputs, as will be described below.

Figure 2:
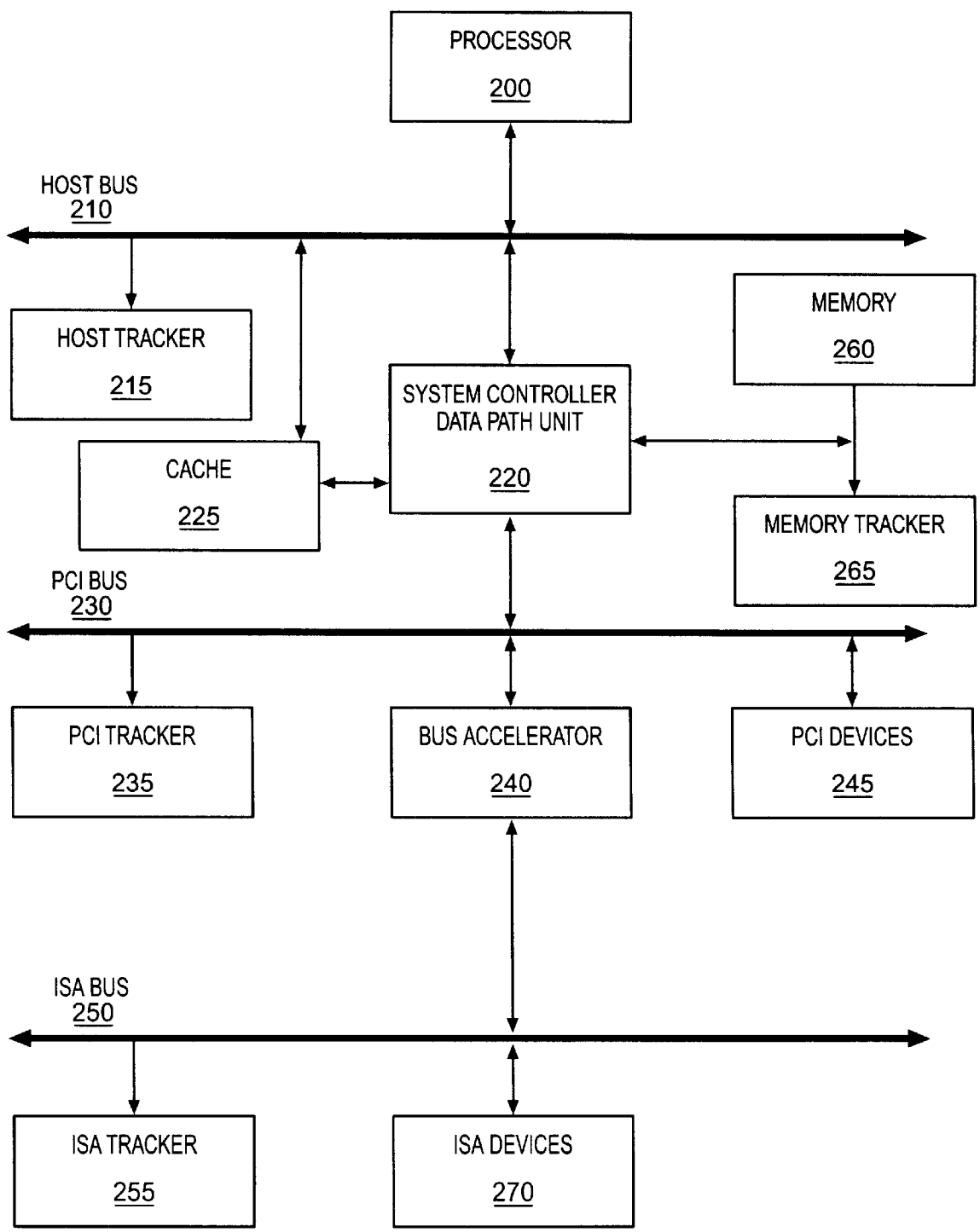
FIG. 2 is a block diagram of one embodiment of a system level simulation environment.

FIG. 2 is a block diagram of one embodiment of a system level simulation environment. The simulation environment may be simulated in a pre-silicon processing step to detect errors design. For another embodiment, the simulation environment is implemented post-silicon to determine whether the element performs as designed.

Referring to FIG. 2, processor 200 is coupled to the host bus 210. A host tracker 215 is coupled to the host bus 210. The host tracker 215 tracks all commands, data, and events that move across the host bus 210. A system controller/data path unit (SCDP) 220 is also coupled to the host bus 210. The SCDP 220 is coupled to the memory 260 and the cache 225. A memory tracker 265 is further coupled to the memory 260. For one embodiment, a cache tracker may be coupled to the cache 225.

The SCDP 220 is also coupled to a PCI bus 230. A PCI tracker 235 is coupled to the PCI bus 230 to track all transactions across the PCI bus 230. A bus accelerator 240 is coupled to the PCI bus 230 as well. Additional PCI devices 245 may also be coupled to the PCI bus 230. The bus accelerator 240 is also coupled to an ISA bus 250. And ISA tracker 255 is also coupled to the ISA bus 200. Various ISA devices 270 may also be coupled to the ISA bus 250.

This is merely an exemplary embodiment of a simulation environment. Not all of these elements need to be present in order for the testing mechanism to function. Additionally, alternative types of busses and devices, such as Universal Serial Bus, etc., may be used.

Any device or bus in the system environment may be tested alone or in combination.

Returning to FIG. 2, the system controller/data path unit 220, the bus accelerator 240, the ISA devices 270 coupled to the ISA bus 250, the processor 200 may be tested alone or in combination.

The trackers 215, 235, 255, and 265 track each of the transactions from various locations. This information is passed to a transaction processing unit. The transaction processing unit processes this data, as will be described below.

Figure 3:
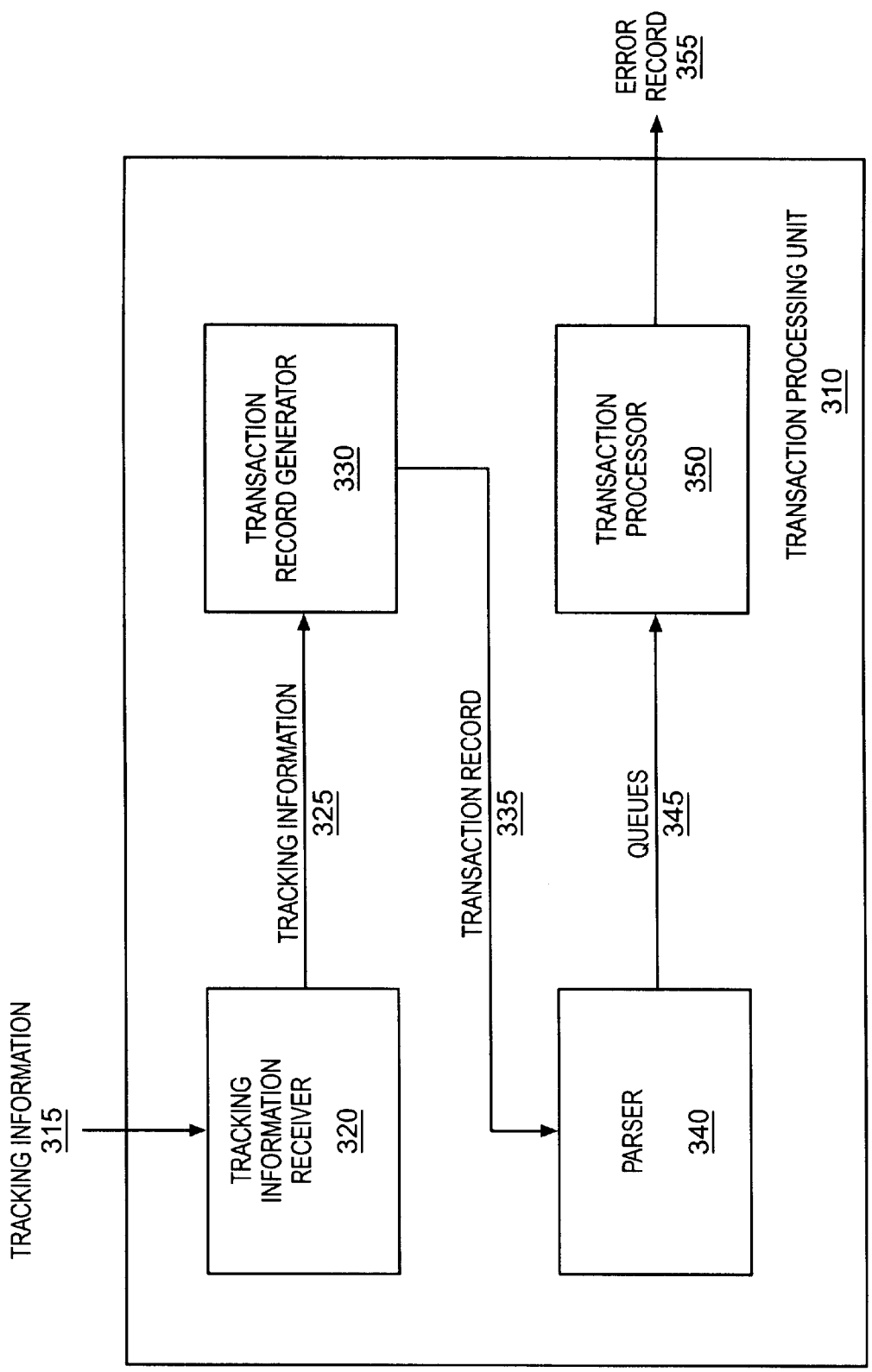
FIG. 3 is a block diagram of one embodiment of the transaction checking system.

FIG. 3 is a block diagram of one embodiment of the transaction processing unit. The transaction processing unit 310 includes a tracking information receiver (TIR) 320. The TIR 320 receives tracking information from the various trackers. For one embodiment, the TIR 320 receives the tracking information continuously, as it is received by the trackers. For another embodiment, the tracking information is sent to the TIR 320 after the simulation is completed. For one embodiment, the TIR 320 is a logic analyzer.

The tracking information receiver 320 passes this information to the transaction record generator (TRG) 330. The TRG 330 translates the information from trackers into a common transaction record. The transaction record contains all pertinent information about an event or transaction necessary to determine the system effects that should result. For one embodiment, the transaction record includes a common, or bus-independent, tag and a bus-specific tag. The common tag contains a fixed amount of information found in all transactions occurring in the system. In a PCI chipset environment, for example, the common tag for one embodiment includes the transaction time, cycle type (read, write, memory I/O), address, and data information.

The bus-specific tag stores information applicable only to the component or interface from which the transaction was recorded. Examples of information about a transaction contained in the tag include: whether it is locked, whether it is a direct-memory access (DMA) cycle, the number of wait-states it received, its snoop-result, its active chip-selects, and its initiator or recipient. The quantity and type of information stored in the bus-specific tag may vary from bus to bus and device to device. The quantity and type of information stored may also vary in different embodiments. For one embodiment, only the amount and type of information needed for testing specific events, data, or commands are stored. The TRG 330 passes this transaction record to the parser 340.

The parser 340 receives the transaction record and parses the information into queues. The queues are temporally ordered lists of transactions grouped according to both the type of bus interface from which they are obtained and the component or unit from which they are initiated. All transactions occurring at a given interface are stored in a general queue for that interface. Transaction copies are also inserted into destination queues according to the unit which initiated it. The process of building the transaction queues is described in more detail with respect to FIG. 4. Once the queues are built, the parser 340 passes them to a transaction processor 350.

Figure 5:
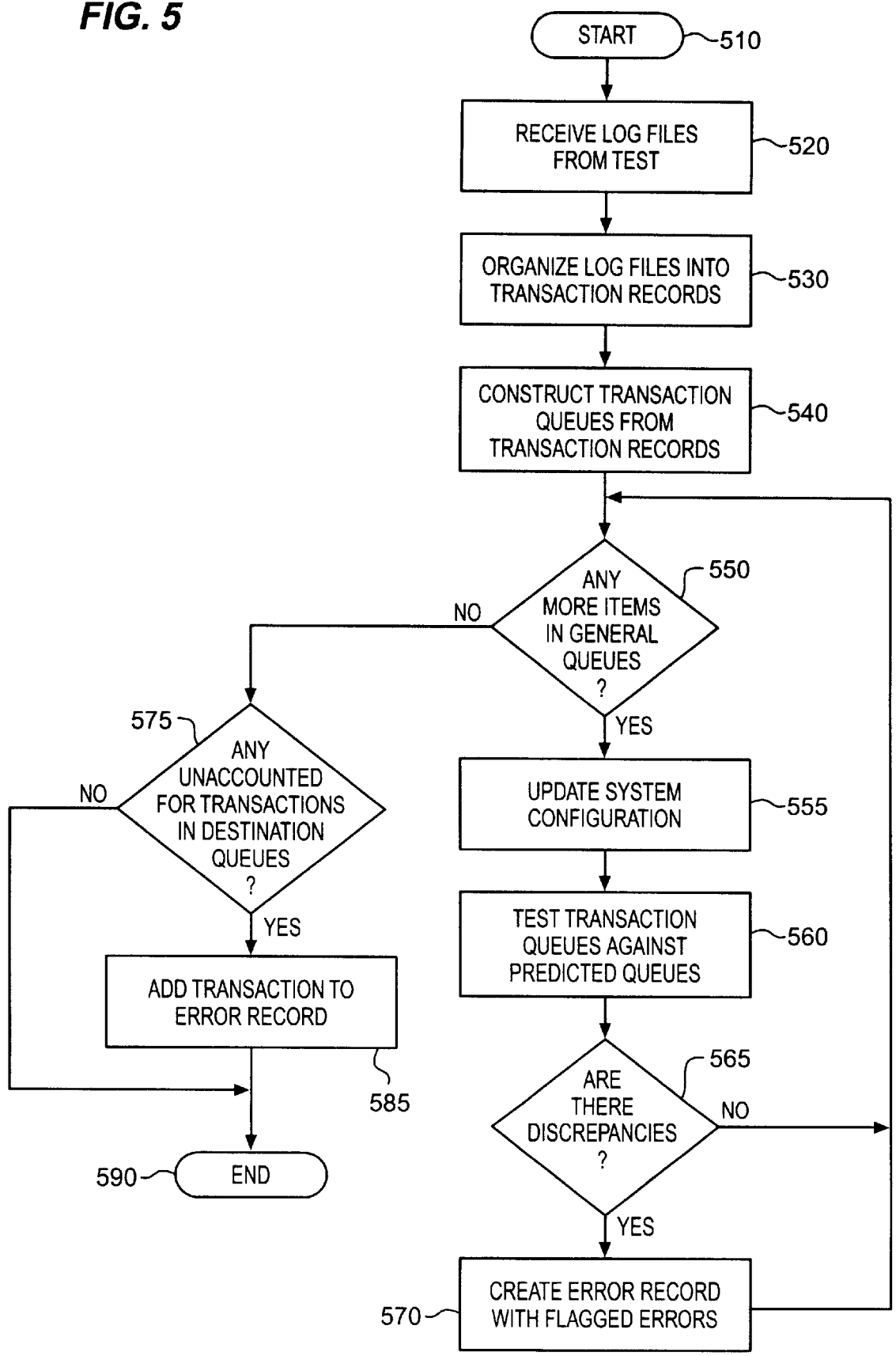
FIG. 5 is a flowchart of one embodiment of the process of the validating a transaction testing unit.
Figure 6:
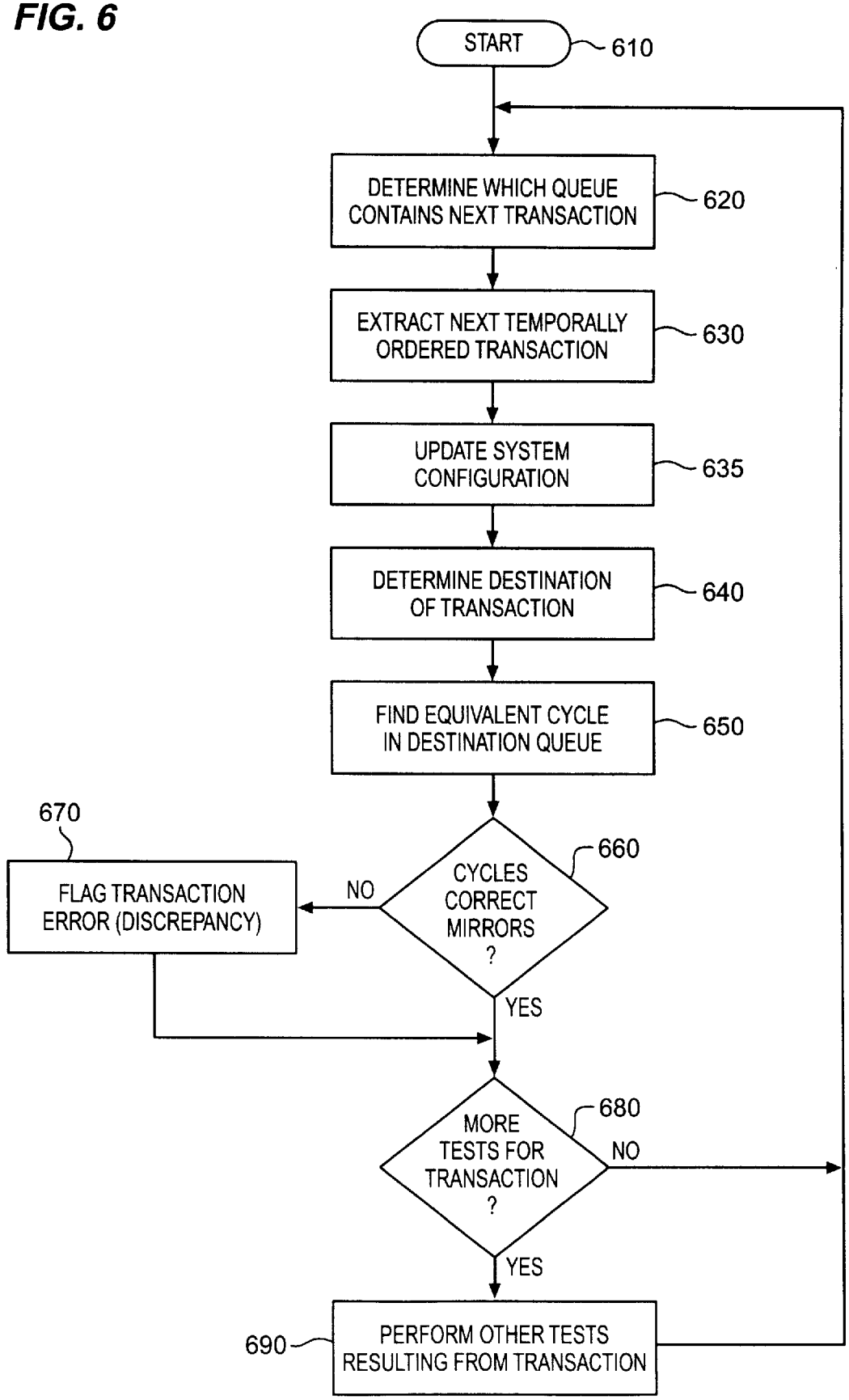
FIG. 6 is a flowchart of one embodiment of the process of testing a transaction.

The transaction processor 350 observes the queued transactions and verifies the transactions are/were correctly handled by the components under test. One embodiment of the method of checking the transaction processing is illustrated in FIGS. 5 and 6 described below.

The transaction processor 350 compares the actual components stored in the queue with the predicted behavior. The predicted behavior is modeled in the transaction processor 350 based on the specification of the component. A behavioral model is built for each component in the transaction processor 350. These behavioral models predict the actual behavior of each component under test for the possible inputs. Because the behavioral model is based on the specification, it represents "accurate" or "proper" behavior for the component.

When any of the rules are violated, the transaction processor 350 reports the failures in an output file. For example, the output file may look as follows:

ERROR: No Snoop cycle was found for this PCI cycle
PCI Cycle: time: 1232 mem write addr: 50 be: 0000 data: 03020100
next-host-cycle:time: 1305 mem write addr: 90 be: 00000000 data: 0706050403020100
ERROR: A non-cacheable CPU cycle did not result in an 12 miss.
Host: time: 1320 mem write addr: 48 be: 00000000 data: 0F0E0D0C0B0A 0908

Some examples of rules for which the transaction processor can test are listed below in Table 1.

TABLE 1

| Transaction Rule Classes | Examples |
| --- | --- |
| Transaction corruption | Address, data, cycle types not changed. Lock asserted when appropriate. Proper/inquire /snoop cycle attributes generated. |
| Address/cycle decoding | Proper decoding/forwarding based on system memory map and I/O devices |
| Cycle translation | CPU address → physical DRAM address. I/O → IDE |
| Data coherency | Stores & compares the most current data value for every memory storage element |
| Cache coherency | Proper cache processing for reads, writes, snoops. |
| Buffer management | Buffers flushed at correct times. |
| Chip-select assertions | Memory Read (addr=0xFFFF0) → BIOS chip-select. |
| Allowable transaction terminations | PCI devices responding when targeted. |
| Transaction ordering | PCI read → buffers flushed → CPU snoop → cache writeback → read completed at main memory. |
| Event handling | parity/ECC error → NMI exception |
| System performance | 3-1-1-1 burst write timing for cache hits. |
| System arbitration | Bus master starvation, memory refresh occurring at programmed rate. |

It is to be understood that different rules may also be tested. Table 1 illustrates one embodiment of a set of rules for testing. However, any behavior which may be described in a specification may be tested.

Figure 4:
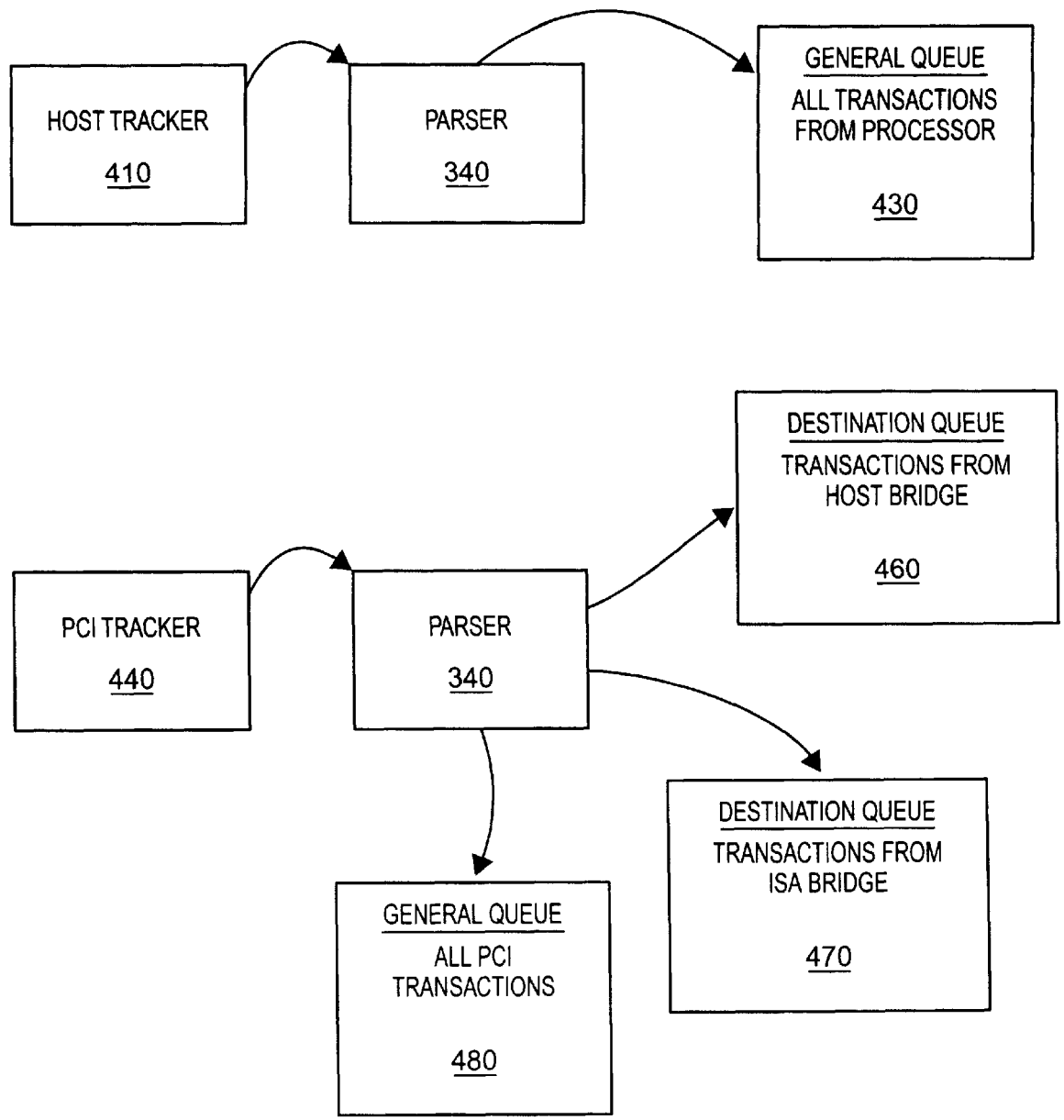
FIG. 4 is a block diagram of one embodiment of transaction queues from trackers in a simulation environment.

FIG. 4 illustrates one example of a parser generating queues from data received by the trackers in the simulation environment. The parser 340 has as an input transaction records 410, which are temporally ordered records of each event. For one embodiment, the information is first processed by the transaction record generator 330.

From this information, the parser 340 generates a general queue 430 for transactions from the processor. For one embodiment, the general queue 430 includes all transactions originated by the processor. For another embodiment, only select transactions are tracked by the host tracker 410, and only those transactions are placed in the general queue 430. For one embodiment, no transactions are oriented to the processor. Therefore, there is no corresponding destination queue.

The parser 340 for the PCI tracker 440 generates a number of queues. A general queue 480 is generated for all transactions originating from the PCI elements. Furthermore, a number of destination queues are generated. For one embodiment, for each element that sends information to the PCI bus, i.e. for which a PCI bus device is a destination, a destination queue 460, 470 is generated. Thus, for example, a first destination queue 460 may include all transactions from the host bridge, while another may include transactions from the ISA bridge 470.

FIG. 5 is a flowchart of one embodiment of the process of validating a transaction testing unit. At block 510, the process starts. The process starts when tracking data is received from the trackers. For one embodiment, the process starts after the simulation is complete. For another embodiment, this testing is concurrent with the simulation.

At block 520, log files from the test are received. These log files are generated by the trackers. The log files include the data received by each of the trackers. For one embodiment, a separate log file corresponds to the data from each tracker.

At block 530, the log files are organized into transaction records. As discussed above, the transaction records include the information about the event necessary to determine expected system effects. The transaction records include all pertinent information about an even in the log file. The transaction record may include a common tag and a bus-specific tag. The transaction record may be temporally ordered.

At block 540, transaction queues are constructed from the transaction records. These transaction queues are temporally ordered, and for one embodiment are checked in the temporal order. The generation of the transaction queues is described above with respect to FIG. 4.

At block 550, the system tests whether there are any transactions remaining in the queue that have not been checked off. For one embodiment, the general queues are checked in order of execution, i.e. according to what time they were processed. If no more items are found in the general queues, the process continues to block 575. If more items are found in the queues, the process continues to block 555.

At block 555, the system configuration is updated. For one embodiment, the transaction processor state information encoded in the transaction is used to update the system configuration. The state information at the time the transaction was executed is used to evaluate whether a transaction was executed properly.

At block 560, transaction queues are compared against the predicted queues. Additionally, each item in the general queue that has a corresponding item in the destination queue is checked off, and vice versa. This process is described in more detail in FIG. 6. This is described in more detail with respect to FIG. 6.

At block 565, the process tests whether any discrepancies were found between the actual behavior and the predicted behavior. If no discrepancies are found, the process returns to block 550, querying whether more items remain in the queues. If discrepancies are found, the process continues to block 570. At block 570, an error record is created with the flagged errors. For one embodiment, the error record is as illustrated above, i.e. a text that indicates the queue, the time, and the discrepancy found. The process then returns to block 550.

If, at block 550, it is found that no more items remain in the queues, the process continues to block 575.

At block 575, the destination queues are checked for any unaccounted-for transactions. Generally during the comparison each transaction on a general queue is matched up with the corresponding transaction on the destination queue. If no unaccounted-for transactions are found, the process continues directly to block 590. If an item is found in the destination queue that was not found in the general queue, the process continues to block 585. At block 585, the unaccounted-for transactions are added to the error record.

The process then continues to block 590, where it ends. At this point, the process has produced an error record which may or may not have any errors in it. This error record may be further analyzed via computer, or visually inspected.

FIG. 6 illustrates one embodiment of the process of testing a transaction. At block 610, the process starts. For one embodiment, the process described for FIG. 6 corresponds to blocks 555 and 560 of FIG. 5. The process tests the transaction queues.

Returning to FIG. 6, at block 620, the process determines which queue contains the next transaction. For one embodiment, the next transaction is determined based on the time the transaction occurred. For another embodiment, an alternative organization of the transactions may be used.

At block 630, the next transaction is extracted from the appropriate general queue.

At block 640, the destination of the transaction is determined. The transactions may target or originate from such components as the processor, cache, main memory, keyboard, DMA, IDE, or other PCI/ISA/EISA devices.

At block 650, an equivalent cycle is found in the destination queue. For each transaction in the general queue, there should be an equivalent cycle in the destination queue. For one embodiment, some transactions may have multiple destinations. For such commands, multiple destination queues may be checked. For example, for a memory read, first a cache may be checked, then a memory may be checked. Therefore, two destination queues, associated with the cache and the memory respectively, are checked for such a transactions. For another embodiment, no destination queues may be checked for a given transaction.

At block 660, the process tests whether the cycles are correct mirrors of each other. For one embodiment, the process tests whether the address and data are identical, and whether the timing is appropriate. For one embodiment, this is tested by comparing various bus tags of the transaction. For example, if the time between sending a transaction and its receipt by the destination queue are overly long, it may be flagged as a discrepancy.

This validates system transactions by ensuring that the cycle is not corrupted at any intermediate point in the system. For example, a transaction between the processor and ISA bus is validated by independently validating the separate transactions from the processor to the PCI bus, and from the PCI bus to the ISA bus. If the transaction is propagated through each of the components without corruption, then it has been validated for the entire path. Thus, for example, for a memory read, originating at the PCI interface, the destination is the memory. Therefore, a destination queue associated with the memory, for transactions originating from the PCI interface is found and the read is compared with the transaction received at the memory.

If the cycles are not correct mirrors of each other, the process continues to block 670.

At block 670, the transaction is flagged as having an error. For one embodiment, copies of the general queue and the destination queue are both flagged. The process then returns to block 680. If the cycles were correct mirrors, the process continues directly to block 680.

At block 680, the process tests whether there are any further tests for the transaction. Some transactions are suitable for additional tests. For example, the process may test for the proper number of wait states, buffer management, chip-select pins asserted at the appropriate time, etc. The process checks whether proper side-effect transactions have occurred. One embodiment of a table of the transaction rule classes that may be tested is listed above as Table 1. This type of testing is based on the predicted behavior of the device/computer system being tested. For one embodiment, the testing uses the tags contained in the general and destination transaction tags in order to predict behavior. As an example, for system components targeting main memory the process not only validates the main memory transaction, but also ensures that the proper cache inquire cycles occur.

If no additional tests are needed, the process returns to block 620 to determine which queue contains the next transaction. If more tests are needed, the process continues to block 690.

At block 690, the additional tests are performed. These additional tests may be the ones listed above, or any other tests that may be performed with the data provided. The process then returns to block 620. In this way, each transaction is tested against the destination queue and against other benchmarks which are expected of its performance.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
   receiving tracking data generated by at least a first tracker and a second tracker of a simulation environment, the first tracker tracking transactions crossing a first transaction interface and the second tracker tracking transactions crossing a second transaction interface;
   parsing the transaction data into a plurality of queues including a first general queue associated with a first device residing on the first transaction interface, a second general queue associated with a second device residing on the second transaction interface, a first destination queue associated with the first device, and a second destination queue associated with the second device, the first general queue to store transaction records corresponding to transactions originated by the first device, the second general queue to store transaction records corresponding to transactions originated by the second device, the first destination queue to store transaction records corresponding to transactions targeted for the first device, and the second destination queue to store transaction records corresponding to transactions targeted for the second device; and
   verifying bus transactions originated by the first device and targeted for the second device by comparing corresponding transaction records from the first general queue and the second destination queue.

2. The method of claim 1, further comprising verifying bus transactions originated by the second device and targeted for the first device by comparing corresponding transaction records from the second general queue and the first destination queue.

3. The method of claim 1, further comprising detecting any unaccounted-for transactions for the first device by testing whether there are any transaction records remaining on the first destination queue after all transaction records from general queues associated with other devices from which transactions targeted for the first device were originated have been matched up with corresponding transaction records from the first destination queue.

4. The method of claim 3, further comprising:
   flagging the unaccounted-for transactions;

generating an error record; and adding the flagged unaccounted-for transactions to the error record.

5. The method of claim 1, further comprising detecting any unaccounted-for transactions for the second device by testing whether there are any transaction records remaining on the second destination queue after all transaction records from general queues associated with other devices from which transactions targeted for the second device were originated have been matched up with corresponding transaction records from the second destination queue.

6. The method of claim 5, further comprising:

flagging the unaccounted-for transactions;

generating an error record; and adding the flagged unaccounted-for transactions to the error record.

7. The method of claim 1, further comprising verifying bus transactions originated by the first device and targeted for the second device by comparing corresponding transaction records from the first general queue and a second predicted behavior queue, wherein the second predicted behavior queue comprising behavioral model transactions based on a specification of the second device.

8. The method of claim 1, further comprising verifying bus transactions originated by the second device and targeted for the first device by comparing corresponding transaction records from the second general queue and a first predicted behavior queue, wherein the first predictive behavior queue comprising behavioral model transactions based on a specification of the first device.

9. The method of claim 1, further comprising detecting any unaccounted-for transactions for the first device by testing whether there are any transaction records remaining on a first predicted behavior queue after all transaction records from general queues associated with other devices from which transactions targeted for the first device were originated have been matched up with corresponding transaction records from the first predicted behavior queue.

10. The method of claim 9, further comprising:

flagging the unaccounted-for transactions;

generating and error record; and adding the flagged unaccounted-for transactions to the error record.

11. The method of claim 1, further comprising detecting any unaccounted-for transactions for the second device by testing whether there are any transaction records remaining on a second predicted behavior queue after all transaction records from general queues associated with other devices from which transactions targeted for the second device were originated have been matched up with corresponding transaction records from the second predicted behavior queue.

12. The method of claim 11, further comprising:

flagging the unaccounted-for transactions;

generating an error record; and adding the flagged unaccounted-for transactions to an error record.

13. The method of claim 1, wherein the tracking data is generated by the first tracker and the second tracker saving each incoming and outgoing data.

14. The method of claim 1, further comprising constructing a transaction record from which the plurality of queues are generated.

15. The method of claim 1, further comprising updating system configuration in accordance with a current programming state.

16. The method of claim 1, wherein the tracking data comprises transaction records including a bus-specific tag and a bus-independent tag.

17. The method of claim 16, wherein the bus-independent tag includes one or more of the following status and event indications: transaction time, cycle type, address, data information.

18. The method of claim 17, wherein the bus-specific tag includes one or more of the following status and event indications: locked status, cycle translation, cache coherency, buffer management, chip-select assertion, transaction termination, event handling, timing, system arbitration events.

19. The method of claim 16, further comprising:

verifying the bus-specific tag and the bus-independent tag by comparing the tags with a first predicted behavior queue and a second predicted behavior queue; and determining discrepancies between actual behavior as indicated by the tags and the predicted behavior as indicated by the predicted behavior queues.

20. A system comprising:

at least a first tracker and a second tracker to generate tracking data, the first tracker tracking transactions crossing a first transaction interface and the second tracker tracking transactions crossing a second transaction interface;

a parser to parse the transaction data into a plurality of queues including a first general queue associated with a first device residing on the first transaction interface, a second general queue associated with a second device residing on the second transaction interface, a first destination queue associated with the first device, and a second destination queue associated with the second device, the first general queue to store transaction records corresponding to transactions originated by the first device, the second general queue to store transaction records corresponding to transactions originated by the second device, the first destination queue to store transaction records corresponding to transactions targeted for the first device, and the second destination queue to store transaction records corresponding to transactions targeted for the second device; and a transaction processor to verify bus transactions originated by the first device and targeted for the second device by comparing corresponding transaction records from the first general queue and the second destination queue.

21. The system of claim 20, where the transaction processor is further to verify bus transactions originated by the second device and targeted for the first device by comparing corresponding transaction records from the second general queue and the first destination queue.

22. The system of claim 20, wherein the transaction processor is further to detect any unaccounted-for transactions for the first device by testing whether there are any transaction records remaining on the first destination queue after all transaction records from general queues associated with other devices from which transactions targeted for the first device were originated have been matched up with corresponding transaction records from the first destination queue.

23. The system of claim 22, wherein the transaction processor is further to:

flag the unaccounted-for transactions;

generate an error record; and add the flagged unaccounted-for transactions to the error record.

24. The system of claim 20, wherein the transaction processor is further to detect any unaccounted-for transactions for the second device by testing whether there are any transaction records remaining on the second destination queue after all transaction records from general queues associated with other devices from which transactions targeted for the second device were originated have been matched up with corresponding transaction records from the second destination queue.

25. The system of claim 24, wherein the transaction processor is further to:

flag the unaccounted-for transactions;

generate an error record; and add the flagged unaccounted-for transactions to the error record.

26. The system of claim 20, wherein the transaction processor is further to verify bus transactions originated by the first device and targeted for the second device by comparing corresponding transaction records from the first general queue and a second predicted behavior queue, wherein the second predictive behavior queue comprising behavioral model transactions based on a specification of the second device.

27. The system of claim 20, wherein the transaction processor is further to verify bus transactions originated by the second device and targeted for the first device by comparing corresponding transaction records from the second general queue and a first predicted behavior queue, wherein the first predictive behavior queue comprising behavioral model transactions based on a specification of the first device.

28. The system of claim 20, wherein the transaction processor is further to detect any unaccounted-for transactions for the first device by testing whether there are any transaction records remaining on a first predicted behavior queue after all transaction records from general queues associated with other devices from which transactions targeted for the first device were originated have been matched up with corresponding transaction records from the first predicted behavior queue.

29. The system of claim 28, wherein the transaction processor is further to:

flag the unaccounted-for transactions;

generate an error record; and add the flagged unaccounted-for transactions to the error record.

30. The system of claim 20, wherein the transaction processor is further to detect any unaccounted-for transactions for the second device by testing whether there are any transaction records remaining on a second predicted behavior queue after all transaction records from general queues associated with other devices from which transactions targeted for the second device were originated have been matched up with corresponding transaction records from the second predicted behavior queue.

31. The system of claim 30, wherein the transaction process is further to:

flag the unaccounted-for transactions;

generate an error record; and add the flagged unaccounted-for transactions to the error record.

32. A method comprising:

receiving tracking data generated by at least a first tracker and a second tracker of a simulation environment, the first tracker tracking transactions crossing a first transaction interface and the second tracker tracking transactions crossing a second transaction interface;

parsing the transaction data into a plurality of queues including a first general queue associated with a first device residing on the first transaction interface, a second general queue associated with a second device residing on the second transaction interface, a first destination queue associated with the first device, and a second destination queue associated with the second device, the first general queue to store transaction records corresponding to transactions originated by the first device, the second general queue to store transaction records corresponding to transactions originated by the second device, the first destination queue to store transaction records corresponding to transactions targeted for the first device, and the second destination queue to store transaction records corresponding to transactions targeted for the second device; and verifying bus transactions originated by the first device and targeted for the second device by comparing corresponding transaction records from the first general queue and a second predicted behavior queue, wherein the second predictive behavior queue comprising behavioral model transactions based on a specification of the second device.

33. The method of claim 32, further comprising verifying bus transactions originated by the second device and targeted for the first device by comparing corresponding transaction records from the second general queue and a first predicted behavior queue, wherein the first predictive behavior queue comprising behavioral model transactions based on a specification of the first device.

34. The method of claim 32, further comprising detecting any unaccounted-for transactions for the first device by testing whether there are any transaction records remaining on the first predicted behavior queue after all transaction records from general queues associated with other devices from which transactions targeted for the first device were originated have been matched up with corresponding transaction records from the first predicted behavior queue.

35. The method of claim 34, further comprising:

flagging the unaccounted-for transactions;

generating and error record; and adding the flagged unaccounted-for transactions to the error record.

36. The method of claim 32, further comprising detecting any unaccounted-for transactions for the second device by testing whether there are any transaction records remaining on the second predicted behavior queue after all transaction records from general queues associated with other devices from which transactions targeted for the second device were originated have been matched up with corresponding transaction records from the second predicted behavior queue.

37. The method of claim 36, further comprising:

flagging the unaccounted-for transactions;

generating an error record; and adding the flagged unaccounted-for transactions to an error record.

38. A transaction processing unit comprising:

a tracking data receiver to receive tracking data generated by at least a first tracker and a second tracker of a simulation environment, the first tracker tracking transactions crossing a first transaction interface and the second tracker tracking transactions crossing a second transaction interface a parser to parse the transaction data into a plurality of queues including a first general queue associated with a first device residing on the first transaction interface, a second general queue associated with a second device residing on the second transaction interface, a first destination queue associated with the first device, and a second destination queue associated with the second device, the first general queue to store transaction records corresponding to transactions originated by the first device, the second general queue to store transaction records corresponding to transactions originated by the second device, the first destination queue to store transaction records corresponding to transactions targeted for the first device, and the second destination queue to store transaction records corresponding to transactions targeted for the second device; and a transaction processor to verify bus transactions originated by the first device and targeted for the second device by comparing corresponding transaction records from the first general queue and a second predicted behavior queue, wherein the second predictive behavior queue comprising behavioral model transactions based on a specification of the second device.

39. The transaction processing unit of claim 38, further comprising a transaction record generator for generating a transaction record from the tracking data.

40. The transaction processing unit of claim 38, wherein the transaction processor is further to verify bus transactions originated by the second device and targeted for the first device by comparing corresponding transaction records from the second general queue and a first predicted behavior queue, wherein the first predictive behavior queue comprising behavioral model transactions based on a specification of the first device.

41. The transaction processing unit of claim 38, wherein the transaction processor is further to detect any unaccounted-for transactions for the first device by testing whether there are any transaction records remaining on a first predicted behavior queue after all transaction records from general queues associated with other devices from which transactions targeted for the first device were originated have been matched up with corresponding transaction records from the first predicted behavior queue.

42. The transaction processing unit of claim 38, wherein the transaction processor is further to detect any unaccounted-for transactions for the second device by testing whether there are any transaction records remaining on the second predicted behavior queue after all transaction records from general queues associated with other devices from which transactions targeted for the second device were originated have been matched up with corresponding transaction records from the second predicted behavior queue.

43. The transaction processing unit of claim 38, wherein the transaction processor is further to verify bus transactions originated by the first device and targeted for the second device by comparing corresponding transaction records from the first general queue and the second destination queue.

44. The transaction processing unit of claim 38, wherein the transaction processor is further to verify bus transactions originated by the second device and targeted for the first device by comparing corresponding transaction records from the second general queue and the first destination queue.

45. The transaction processing unit of claim 38, wherein the transaction processor is further to detect any unaccounted-for transactions for the first device by testing whether there are any transaction records remaining on the first destination queue after all transaction records from general queues associated with other devices from which transactions targeted for the first device were originated have been matched up with corresponding transaction records from the first destination queue.

46. The transaction processing unit of claim 38, wherein the transaction processor is further to detect any unaccounted-for transactions for the second device by testing whether there are any transaction records remaining on the second destination queue after all transaction records from general queues associated with other devices from which transactions targeted for the second device were originated have been matched up with corresponding transaction records from the second destination queue.

47. The transaction processing unit of claim 38, wherein the transaction processor is further to generate an error record including the unaccounted-for transactions.

48. The transaction processing unit of claim 47, wherein the unaccounted-for transactions comprise extra transactions, missing transactions, or corrupted transactions.

49. An apparatus comprising:

means for receiving tracking data generated by at least a first tracker and a second tracker of a simulation environment, the first tracker tracking transactions crossing a first transaction interface and the second tracker tracking transactions crossing a second transaction interface means for parsing the transaction data into a plurality of queues including a first general queue associated with a first device residing on the first transaction interface, a second general queue associated with a second device residing on the second transaction interface, a first destination queue associated with the first device, and a second destination queue associated with the second device, the first general queue to store transaction records corresponding to transactions originated by the first device, the second general queue to store transaction records corresponding to transactions originated by the second device, the first destination queue to store transaction records corresponding to transactions targeted for the first device, and the second destination queue to store transaction records corresponding to transactions targeted for the second device; and means for verifying bus transactions originated by the first device and targeted for the second device by comparing corresponding transaction records from the first general queue and a second predicted behavior queue, wherein the second predictive behavior queue comprising behavioral model transactions based on a specification of the second device.

50. The apparatus of claim 49, further comprising means for generating a transaction record from the tracking data.

51. The apparatus of claim 49, wherein the means for verifying bus transactions originated by the first device is further for verifying bus transactions originated by the second device and targeted for the first device by comparing corresponding transaction records from the second general queue and a first predicted behavior queue, wherein the first predictive behavior queue comprising behavioral model transactions based on a specification of the first device.

52. The apparatus of claim 49, wherein the means for verifying bus transactions originated by the first device is further for detecting any unaccounted-for transactions for the first device by testing whether there are any transaction records remaining on a first predicted behavior queue after all transaction records from general queues associated with other devices from which transactions targeted for the first device were originated have been matched up with corresponding transaction records from the first predicted behavior queue.

53. The apparatus of claim 49, wherein the means for verifying bus transactions originated by the first device is further for detecting any unaccounted-for transactions for the second device by testing whether there are any transaction records remaining on the second predicted behavior queue after all transaction records from general queues associated with other devices from which transactions targeted for the second device were originated have been matched up with corresponding transaction records from the second predicted behavior queue.

54. The apparatus of claim 49, wherein the means for verifying bus transactions originated by the first device is further for verifying bus transactions originated by the first device and targeted for the second device by comparing corresponding transaction records from the first general queue and the second destination queue.

55. The apparatus of claim 49, wherein the means for verifying bus transactions originated by the first device is further for verifying bus transactions originated by the second device and targeted for the first device by comparing corresponding transaction records from the second general queue and the first destination queue.

56. The apparatus of claim 49, wherein the means for verifying bus transactions originated by the first device is further for detecting any unaccounted-for transactions for the first device by testing whether there are any transaction records remaining on the first destination queue after all transaction records from general queues associated with other devices from which transactions targeted for the first device were originated have been matched up with corresponding transaction records from the first destination queue.

57. The apparatus of claim 49, wherein the means for verifying bus transactions originated by the first device is further for detecting any unaccounted-for transactions for the second device by testing whether there are any transaction records remaining on the second destination queue after all transaction records from general queues associated with other devices from which transactions targeted for the second device were originated have been matched up with corresponding transaction records from the second destination queue.

58. The apparatus of claim 49, wherein the means for verifying bus transactions originated by the first device is further for generating an error record including the unaccounted-for transactions.

59. The apparatus of claim 58, Wherein the unaccounted-for transactions comprise extra transactions, missing transactions, or corrupted transactions.

* * * * *